(12) United States Patent
Khai Yen et al.

(10) Patent No.: US 9,852,928 B2
(45) Date of Patent: Dec. 26, 2017

(54) SEMICONDUCTOR PACKAGES AND MODULES WITH INTEGRATED FERRITE MATERIAL

(71) Applicant: Infineon Technologies AG, Neubiberg (DE)

(72) Inventors: Charles Low Khai Yen, Melaka (MY); Daryl Quake Chin Wern, Melaka (MY)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 14/507,433

(22) Filed: Oct. 6, 2014

(65) Prior Publication Data

US 2016/0099189 A1    Apr. 7, 2016

(51) Int. Cl.
*H01L 23/18*    (2006.01)
*H01L 23/31*    (2006.01)
(Continued)

(52) U.S. Cl.
CPC ...... *H01L 21/4825* (2013.01); *H01L 23/4952* (2013.01); *H01L 23/49562* (2013.01);
(Continued)

(58) Field of Classification Search
CPC ..................... H01L 23/18; H01L 21/28291
See application file for complete search history.

(56) References Cited

U.S. PATENT DOCUMENTS

2001/0023983 A1\* 9/2001 Kobayashi ........ H01L 23/49894
257/698
2004/0061166 A1\* 4/2004 Kim ...................... B82Y 10/00
257/314
(Continued)

FOREIGN PATENT DOCUMENTS

CN          103367338 A    10/2013
DE          10339213 A1     7/2004
(Continued)

OTHER PUBLICATIONS

Weir, Steve; "Understanding Ferrite Beads and Applications"; 2009; IPBLOX LLC; p. 5.\*
(Continued)

*Primary Examiner* — Su C Kim
*Assistant Examiner* — David S Wilbert
(74) *Attorney, Agent, or Firm* — Murphy, Bilak & Homiller, PLLC

(57) ABSTRACT

A semiconductor package includes a lead frame having a die paddle and a plurality of leads including a gate lead spaced apart from the die paddle. The semiconductor package further includes a semiconductor die attached to the die paddle and having a plurality of pads including a gate pad, a plurality of electrical conductors connecting the pads to the leads, an encapsulant encasing the semiconductor die and a portion of the leads such that part of the leads are not covered by the encapsulant, and a ferrite material embedded in the encapsulant and surrounding a portion of the electrical conductor that connects the gate pad to the gate lead. A
(Continued)

method of manufacturing the semiconductor package and a semiconductor module with integrated ferrite material are also provided.

6 Claims, 19 Drawing Sheets

(51) Int. Cl.
*H01L 21/28* (2006.01)
*H01L 23/495* (2006.01)
*H01L 21/48* (2006.01)
*H01L 23/00* (2006.01)

(52) U.S. Cl.
CPC ........ *H01L 23/49575* (2013.01); *H01L 24/06* (2013.01); *H01L 24/49* (2013.01); *H01L 23/3107* (2013.01); *H01L 2224/0603* (2013.01); *H01L 2224/32225* (2013.01); *H01L 2224/48137* (2013.01); *H01L 2224/48139* (2013.01); *H01L 2224/48227* (2013.01); *H01L 2224/48247* (2013.01); *H01L 2224/4903* (2013.01); *H01L 2224/49111* (2013.01); *H01L 2224/73265* (2013.01); *H01L 2924/00014* (2013.01); *H01L 2924/13055* (2013.01); *H01L 2924/13091* (2013.01); *H01L 2924/181* (2013.01); *H01L 2924/19107* (2013.01)

(56) References Cited

U.S. PATENT DOCUMENTS

| | | | |
|---|---|---|---|
| 2004/0125529 A1* | 7/2004 | Arai | H01L 23/24 361/118 |
| 2016/0035672 A1* | 2/2016 | Funaya | H01L 27/0688 257/531 |

FOREIGN PATENT DOCUMENTS

| | | | | |
|---|---|---|---|---|
| JP | 2001185679 A | | 7/2001 | |
| JP | 2012050176 A | | 3/2012 | |
| WO | WO 2014155478 A1 | * | 10/2014 | H01L 24/06 |

OTHER PUBLICATIONS

BL, "Chip Ferrite Bead", Series Introduction, Example of Chip Ferrite Bead BLM Series Structure, Jul. 27, 2012, pp. 13-21.
KOA Speer Electronics,Inc., "CZB Multilayer Ferrite Bead", http://www.koaspeer.com, pp. 1-5.
Murata Manufacturing Co. Ltd., "Ferrite Core for EMI Suppression Microwave Absorber", http://www.murata.com, Mar. 12, 2012, pp. 1-23.
Nass, Richard, "Ferrite Bead Products Fit Tiny Spaces", Embedded—Cracking the Code to Systems Development, http://www.embedded.com, Aug. 17, 2005, pp. 1-3.
Weir, Steve, "Understanding Ferrite Beads and Applications", IPBLOX LLC, Teraspeed Consulting Group, LLC, Z2 Consulting, 2009, pp. 1-39.

* cited by examiner

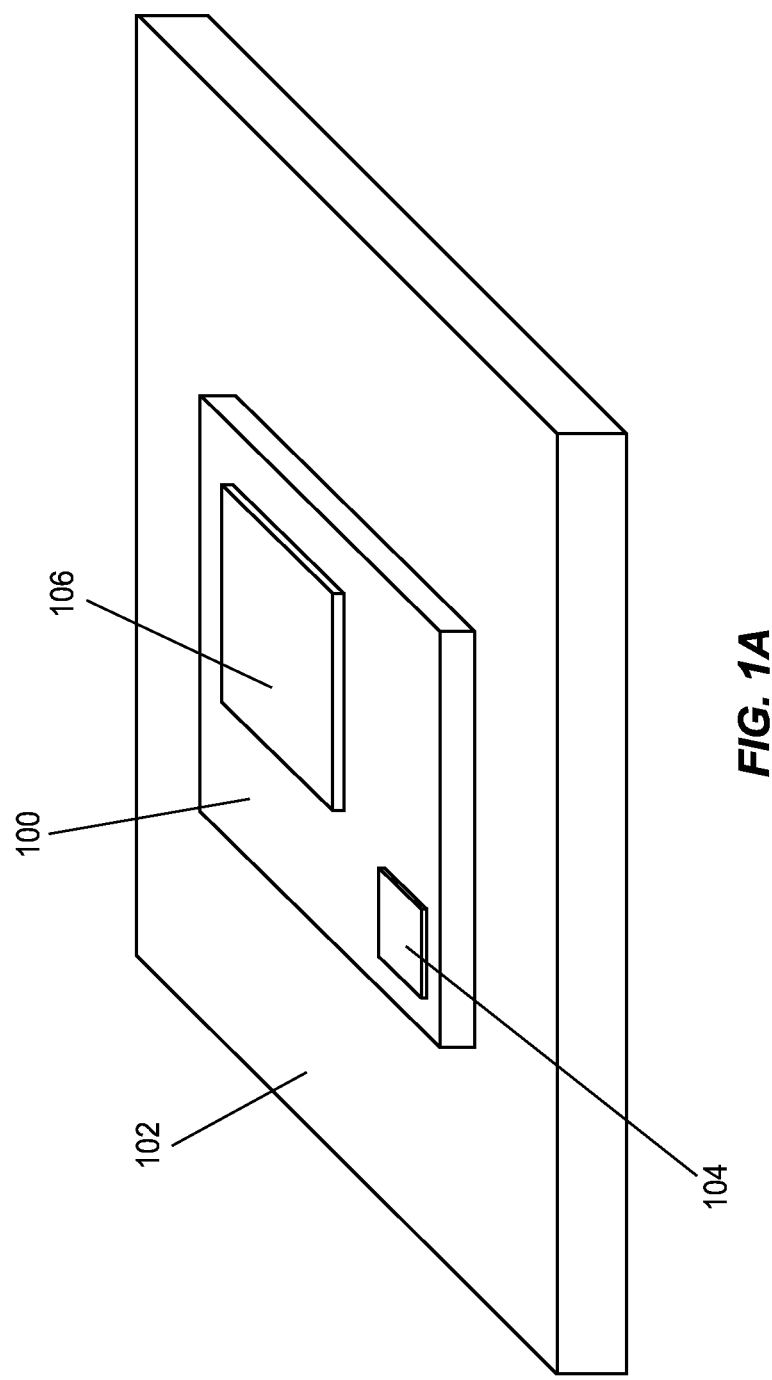

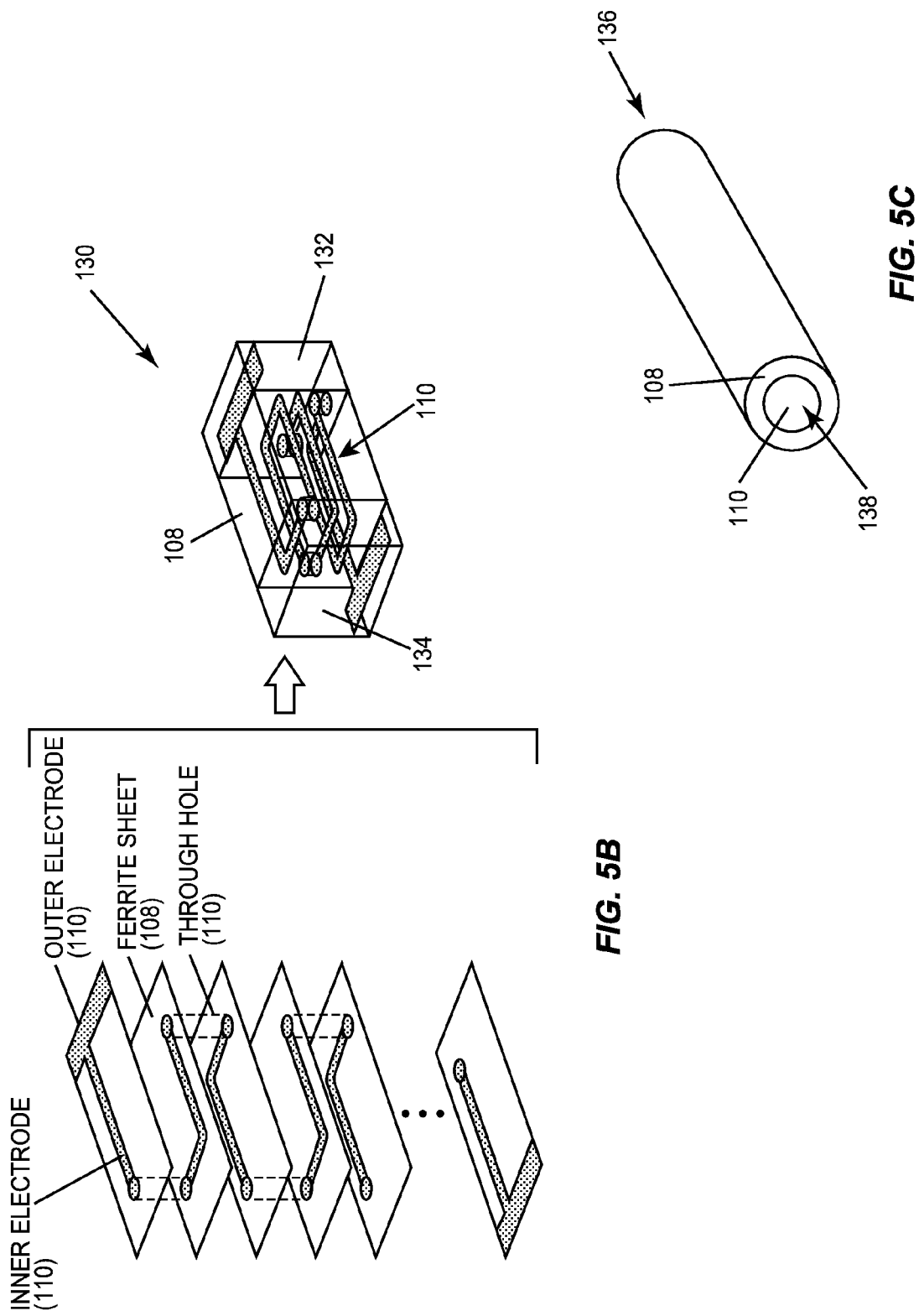

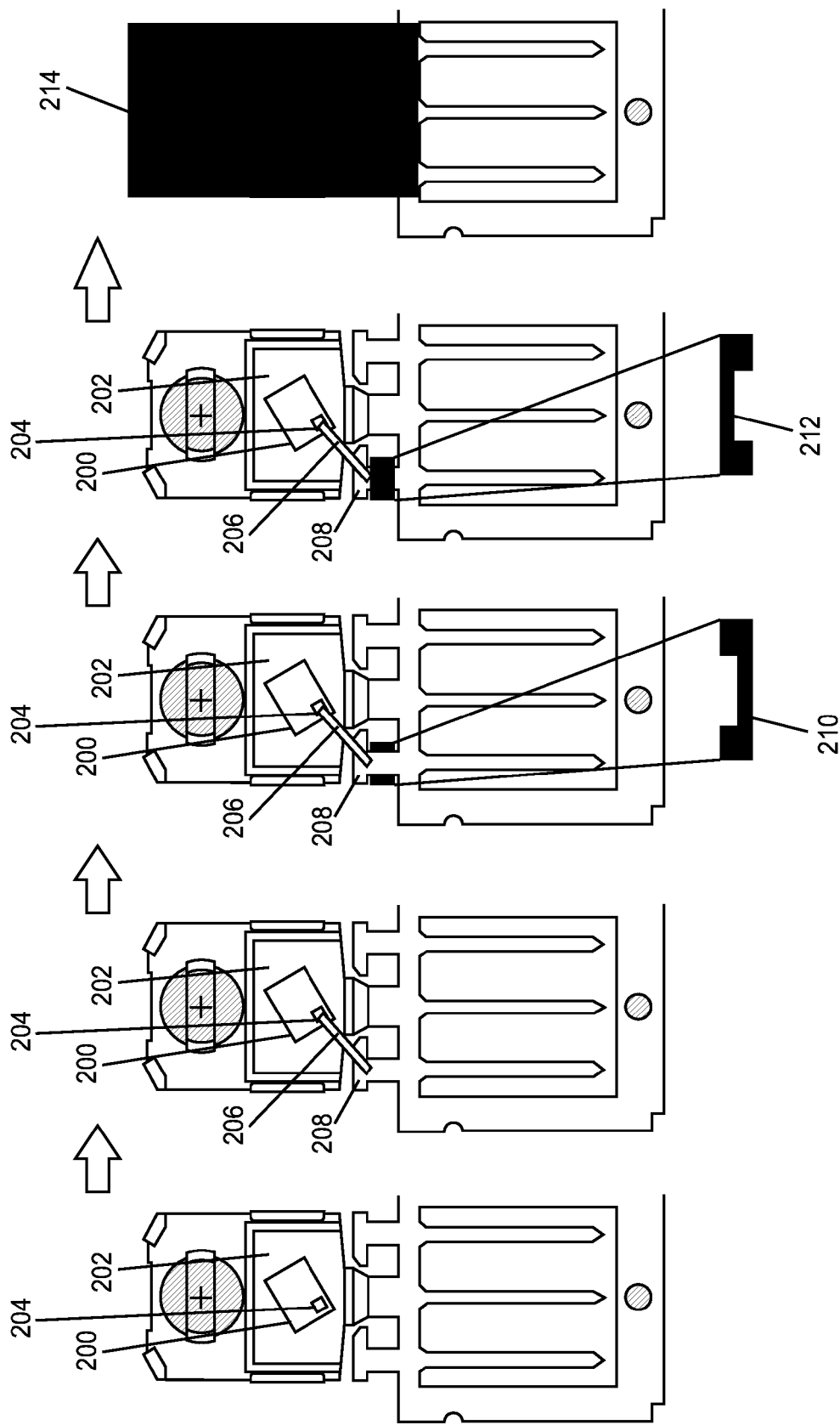

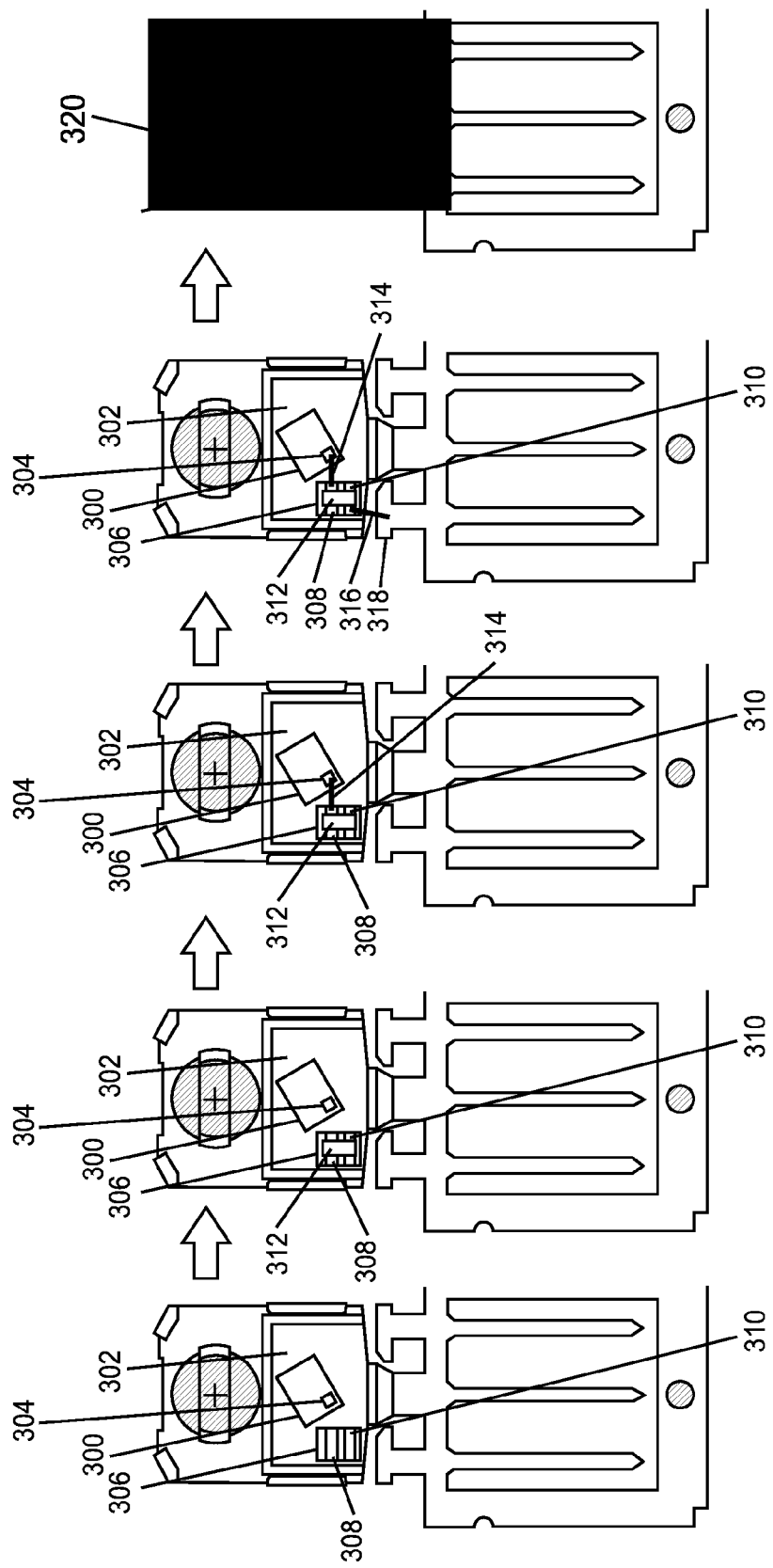

SEMICONDUCTOR PACKAGES AND MODULES WITH INTEGRATED FERRITE MATERIAL

TECHNICAL FIELD

The present application relates to semiconductor packages and modules, in particular high switching frequency semiconductor packages and modules.

BACKGROUND

Power devices such as power MOSFETs (metal oxide semiconductor field effect transistors) and IGBTs (insulated gate bipolar transistors) operating at high switching frequencies e.g. in the range of 50 MHz to 1 GHz or even higher and at low gate resistances e.g. in the range of milli-Ohms to Ohms experience severe oscillations in the output current of the device e.g. the drain current of a power MOSFET or collector current of an IGBT. Such severe oscillations in the output current result in high switching losses, and destruction of the device and corresponding freewheeling diode if left unabated.

SUMMARY

According to an embodiment of a semiconductor package, the semiconductor package comprises a lead frame comprising a die paddle and a plurality of leads including a gate lead spaced apart from the die paddle. The semiconductor package further comprises a semiconductor die attached to the die paddle and having a plurality of pads including a gate pad, a plurality of electrical conductors connecting the pads to the leads, an encapsulant encasing the semiconductor die and a portion of the leads such that part of the leads are not covered by the encapsulant, and a ferrite material embedded in the encapsulant and surrounding a portion of the electrical conductor that connects the gate pad to the gate lead.

According to an embodiment of a method of manufacturing a semiconductor package, the method comprises: providing a lead frame comprising a die paddle and a plurality of leads including a gate lead spaced apart from the die paddle; attaching a semiconductor die to the die paddle, the semiconductor die having a plurality of pads including a gate pad; connecting the pads to the leads via a plurality of electrical conductors; encasing the semiconductor die and a portion of the leads in an encapsulant such that part of the leads are not covered by the encapsulant; and embedding a ferrite material in the encapsulant such that the ferrite material surrounds a portion of the electrical conductor that connects the gate pad to the gate lead.

According to an embodiment of a semiconductor module, the semiconductor module comprises a power semiconductor die attached to a substrate and having a plurality of pads including a gate pad and a logic semiconductor die attached to the same or different substrate as the power semiconductor die and operable to drive the gate pad of the power semiconductor die. The semiconductor module further comprises an electrical conductor connecting the gate pad of the power semiconductor die to the logic semiconductor die, a housing containing the semiconductor dies and the electrical conductor connecting the gate pad of the power semiconductor die to the logic semiconductor die, and a ferrite material contained in the housing and surrounding a portion of the electrical conductor that connects the gate pad of the power semiconductor die to the logic semiconductor die.

Those skilled in the art will recognize additional features and advantages upon reading the following detailed description, and upon viewing the accompanying drawings.

BRIEF DESCRIPTION OF THE FIGURES

The elements of the drawings are not necessarily to scale relative to each other. Like reference numerals designate corresponding similar parts. The features of the various illustrated embodiments can be combined unless they exclude each other. Embodiments are depicted in the drawings and are detailed in the description which follows.

FIG. 1, which includes FIGS. 1A through 1E, illustrates an embodiment of a method of a manufacturing a molded semiconductor package having integrated ferrite material.

FIG. 5, which includes FIGS. 5A through 5C, illustrates an embodiment of a ferrite-based gate electrical conductor for integration in a semiconductor package or module.

FIG. 6, which includes FIGS. 6A through 6E, illustrates an embodiment of a method of a manufacturing a molded semiconductor package having integrated ferrite material.

FIG. 7, which includes FIGS. 7A through 7E, illustrates an embodiment of a method of a manufacturing a molded semiconductor package with integrated ferrite material.

DETAILED DESCRIPTION

Figure 1B:
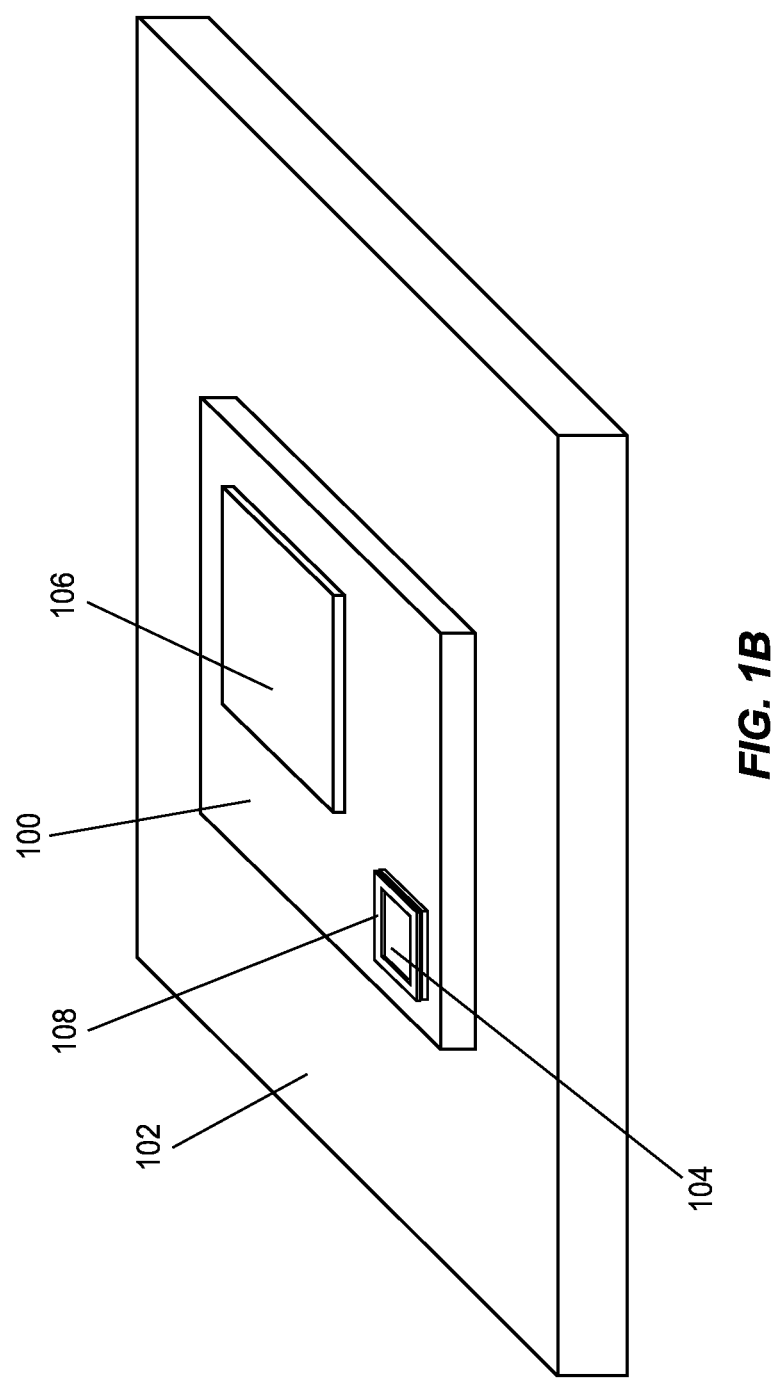

Embodiments described herein integrate ferrite material into semiconductor packages and modules operating at high switching frequencies e.g. in the range of 50 MHz to 1 GHz or even higher and low gate resistances e.g. in the range of milli-Ohms to Ohms. In the case of molded semiconductor packages, the ferrite material is embedded in the encapsulant that encases the components of the package. The term 'encase' as used herein means to cover or to enclose in or as if in a case. In the case of semiconductor modules, the ferrite material is contained in the housing that includes the components of the module. The term 'housing' as used herein refers to something that covers or protects e.g. such as a case or enclosure or an encapsulant such as mold compound. In each case, the ferrite material surrounds at least a portion of the electrical conductor connected to the gate pad of each power semiconductor die included in the package or module. By surrounding at least a portion of the gate conductor with a ferrite material, oscillations in the output current of each power device are suppressed and switching losses are reduced.

FIG. 1, which includes FIGS. 1A through 1E, illustrates a semiconductor die 100 during stages of packaging the die. The semiconductor die 100 includes a power semiconductor transistor such as a power MOSFET or an IGBT.

In FIG. 1A, the bottom side of the die 100 is attached e.g. via solder or other die attach material to a die paddle 102 of a lead frame. A lead frame is a stamped, etched or otherwise patterned metal frame, usually connected to bonding pads of a die by wire bonding, and provides external electrical connections for a packaged electrical device. The die paddle 102 is the part of the lead frame to which the semiconductor die 100 is attached. Depending on the type of semiconductor die 100, the die 100 can be glued or soldered to the lead frame die paddle 102. For example in the case of a vertical transistor, the bottom side of the die 100 can include an output pad soldered to the die paddle 102. The output pad provides an external point of electrical contact for the output terminal of the transistor included in the die 100 e.g. to the drain terminal of a power MOSFET or collector terminal of an IGBT. If no electrical connection is needed at the die backside, the die 100 can be glued to the die paddle 102 to provide a thermal connection to the backside of the die 100.

The top side of the die 100 includes a gate pad 104 and a reference pad 106 for the die 100. The gate pad 104 provides an external point of electrical contact for the gate terminal of the transistor included in the die 100, and the reference pad 106 provides an external point of electrical contact for the reference terminal of the transistor e.g. the source terminal of a power MOSFET or emitter terminal of an IGBT. Alternatively, the reference pad 106 and/or gate pad 104 can be disposed at the bottom side of the die 100 and the output pad (out of view in FIG. 1) can be disposed at the top side of the die 100. In still other embodiments, all pads can be disposed at the top side of the die 100 e.g. in the case of a lateral transistor die.

In FIG. 1B, a ferrite material 108 is disposed in the form of a ring on the gate pad 104 of the semiconductor die 100. In one embodiment, the ferrite material 108 is a ferrite core having a hollow (open) center. Ferrite cores are dense, homogeneous ceramic structures made by mixing e.g. iron oxide ($Fe_2O_3$) with oxides or carbonates of one or more metals such as manganese, zinc, nickel, and/or magnesium. Ferrite cores are formed by pressing and kiln firing the ferrite e.g. to 1300° C., followed by optional machining. Ferrites have high electrical resistivity and low eddy current losses over a wide frequency range as compared to other types of magnetic materials. These characteristics, along with high permeability, make ferrite materials well-suited for use in applications such as high frequency transformers, wideband transformers, adjustable inductors and other high frequency circuitry ranging from 10 kHz to 50 MHz or higher. The thickness and other dimensions of the ferrite material 108 depend on the amount of noise/oscillations/EMI (electromagnetic interference) to be dampened. As such, the optimal thickness and other dimensions of the ferrite material 108 depend on the particular type of application for which the package is designed. The amount of noise/oscillations/EMI dampening provided by the ferrite material 108 also depends on the ferrite material composition. For example, MnZn ferrite materials have a high permeability and NiZn ferrites have a low permeability. Manganese-zinc ferrites are typically used in applications where the operating frequency is less than 5 MHz. Nickel-zinc ferrites have a higher resistivity and are typically used at frequencies from 2 MHz to several hundred MHz. For common mode inductors, the impedance of MnZn material makes it the better choice up to 70 MHz and NiZn the better choice from 70 MHz to several hundred GHz.

The ferrite material 108 can be glued e.g. via epoxy to the gate pad 104 in the case of a ferrite core. Alternatively, the ferrite material 108 can be sputtered or electroplated on the gate pad 104.

Figure 1C:
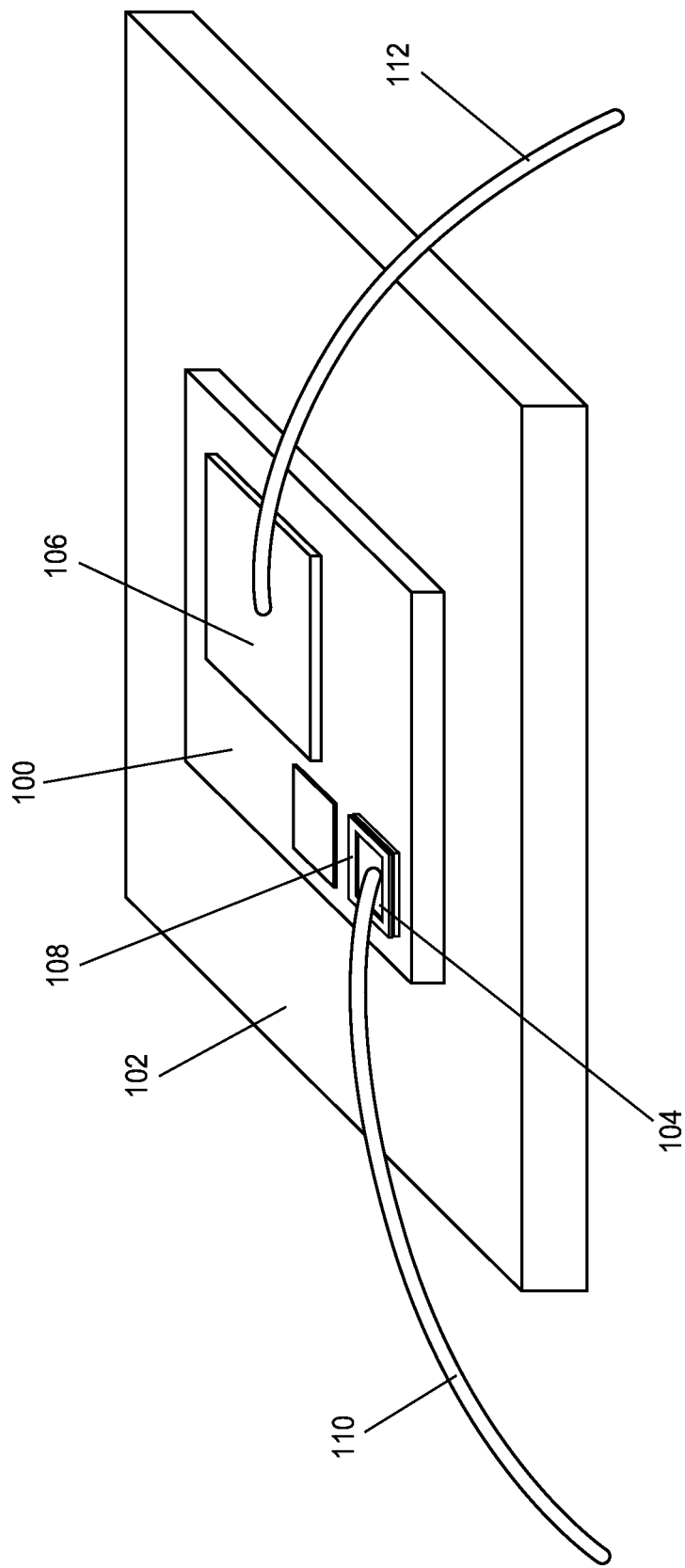

In FIG. 1C, electrical conductors 110, 112 are attached to the pads 104, 106 of the die 100 disposed at the side of the die 100 facing away from the lead frame die paddle 102. The electrical conductors 110, 112 connect the die pads 104, 106 to leads 114 of the lead frame.

Figure 1D:
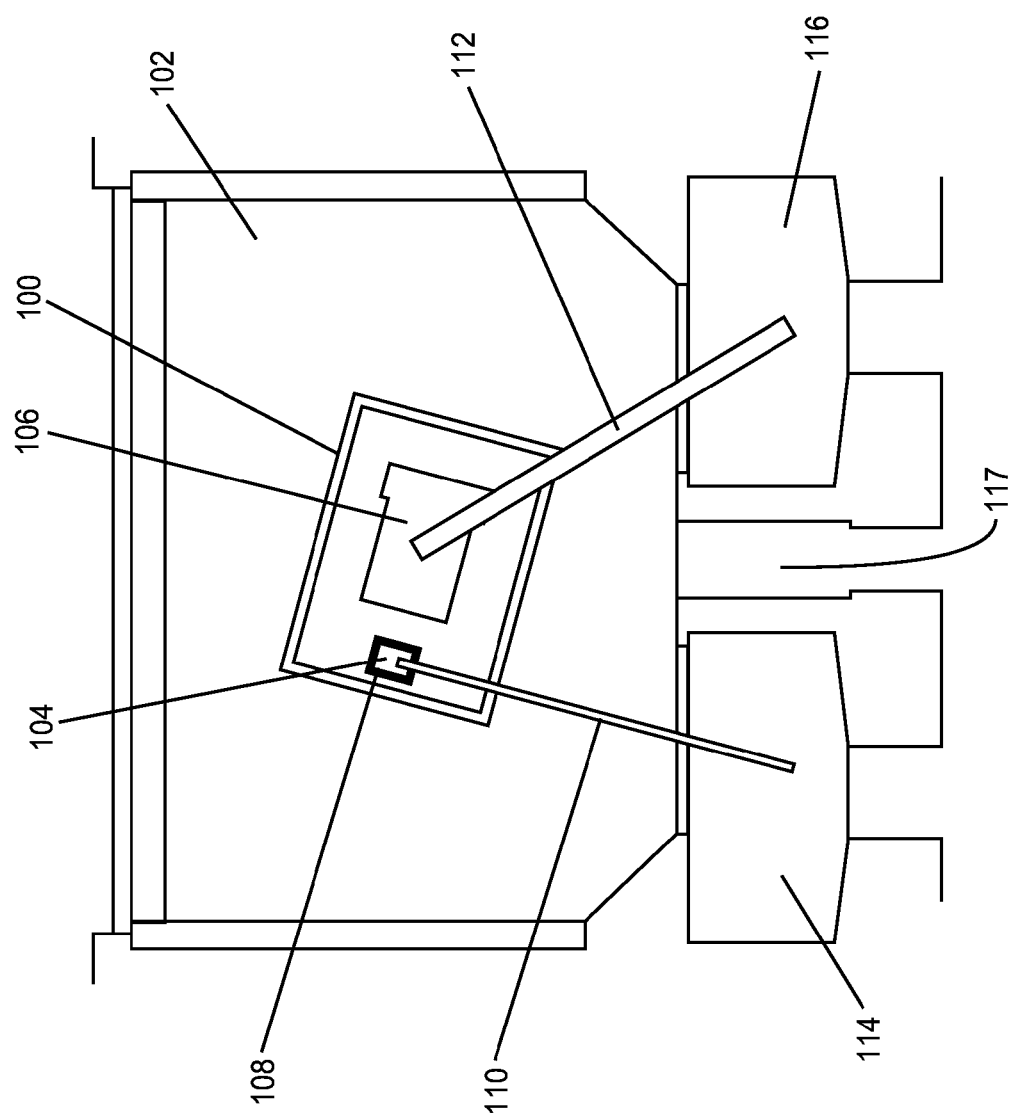

The leads are out of view in FIG. 1C, but shown in the top-down plan view of FIG. 1D. The electrical conductors 110, 112 that connect the die pads 104, 106 to the leads 114, 116 can be wire bonds, wire ribbons, metal clips, etc. In each case, the electrical conductor 110 that connects the gate pad 104 to the gate lead 114 of the lead frame is attached to a part of the gate pad 104 surrounded by the ring of ferrite material 108 to dampen noise/oscillations/EMI. A lead 117 can extend from the die paddle 102. This lead 117 can be the drain lead for a MOSFET or collector lead for an IGBT. The drain/collector lead 117 can be cut to the same length as the gate and source/emitter leads 114, 116 e.g. for TO (transistor outline) packages. In some small packages, the drain/collector lead 117 can be cut shorter if the back surface of the package is used as the drain/collector. The die paddle 102 and the drain/collector lead 117 has the same electrical potential.

Figure 1E:
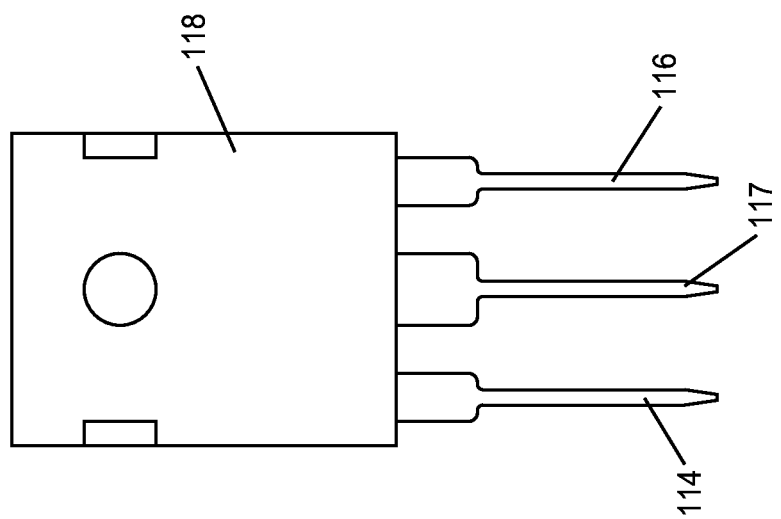

In FIG. 1E, the semiconductor die 100, the ferrite material 108 and a portion of the leads 114, 116, 117 are encased in an encapsulant 118 such as a mold compound so that part of the leads 114, 116, 117 is not covered by the encapsulant 118. For example, the resulting package can be a leaded package (as shown in FIG. 1E) or a leadless package. In either case, the ferrite material 108 is embedded in the encapsulant 118 and surrounds a portion of the electrical conductor 110 that connects the gate pad 104 to the gate lead 114. The ferrite material 108 can be provided at any time up to just prior to the encapsulation process, so that the ferrite material 108 is integrated within the resulting package.

Figure 2:
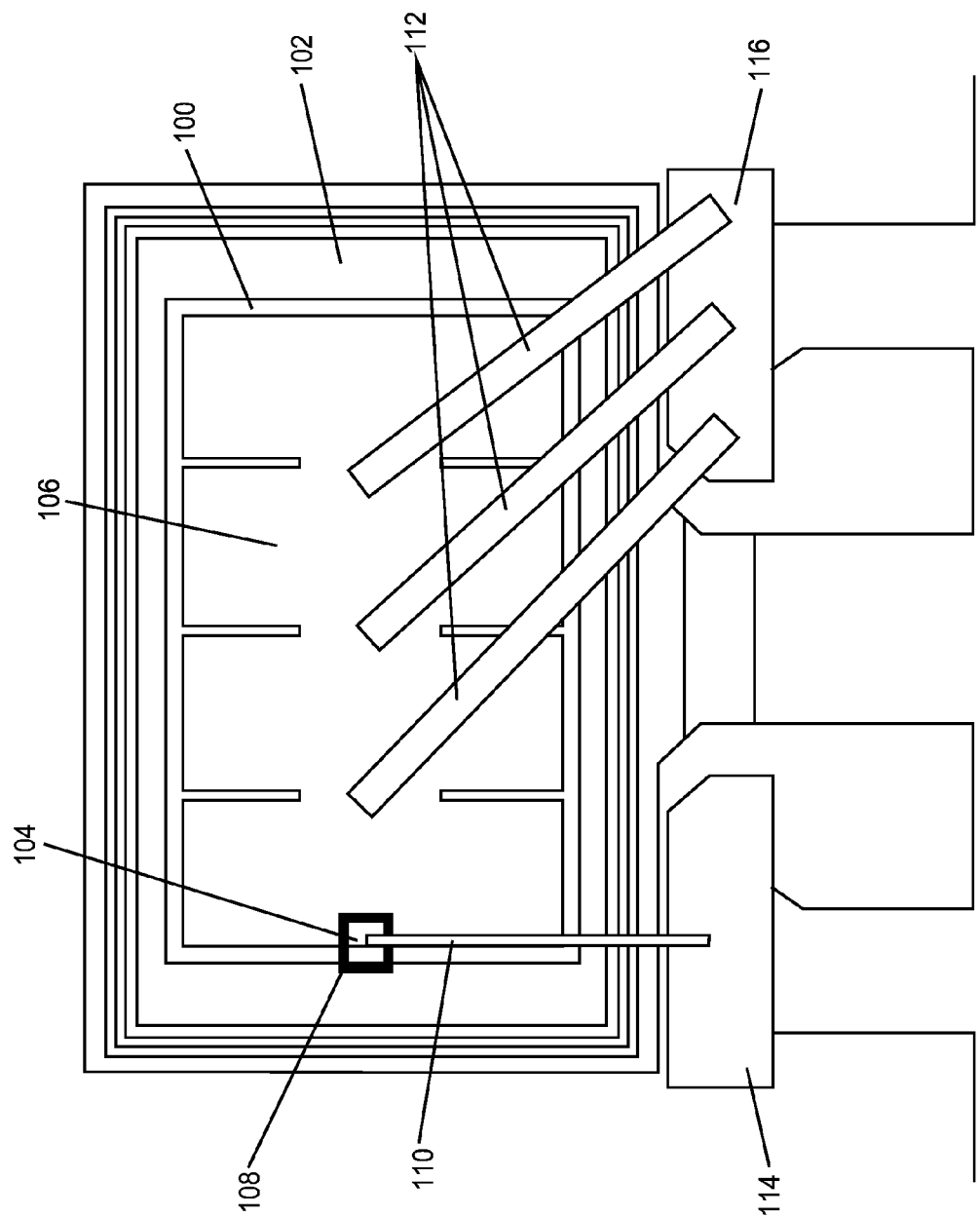
FIG. 2 illustrates a top-down plan view of an embodiment of a molded semiconductor package having integrated ferrite material, prior to encapsulation.

FIG. 2 shows a top-down plan view of a package design similar to the design shown in FIG. 1D prior to encapsulation, however, the semiconductor die 100 contains a bigger transistor in FIG. 2 and therefore more than one electrical conductor 112 is provided for connecting the reference pad 106 of the die 104 to the corresponding lead 116 of the lead frame. In both FIGS. 1D and 2, the ferrite material 108 can contact the reference pad 106 of the semiconductor die 100 or instead be spaced apart from the reference pad 106.

Figure 3:
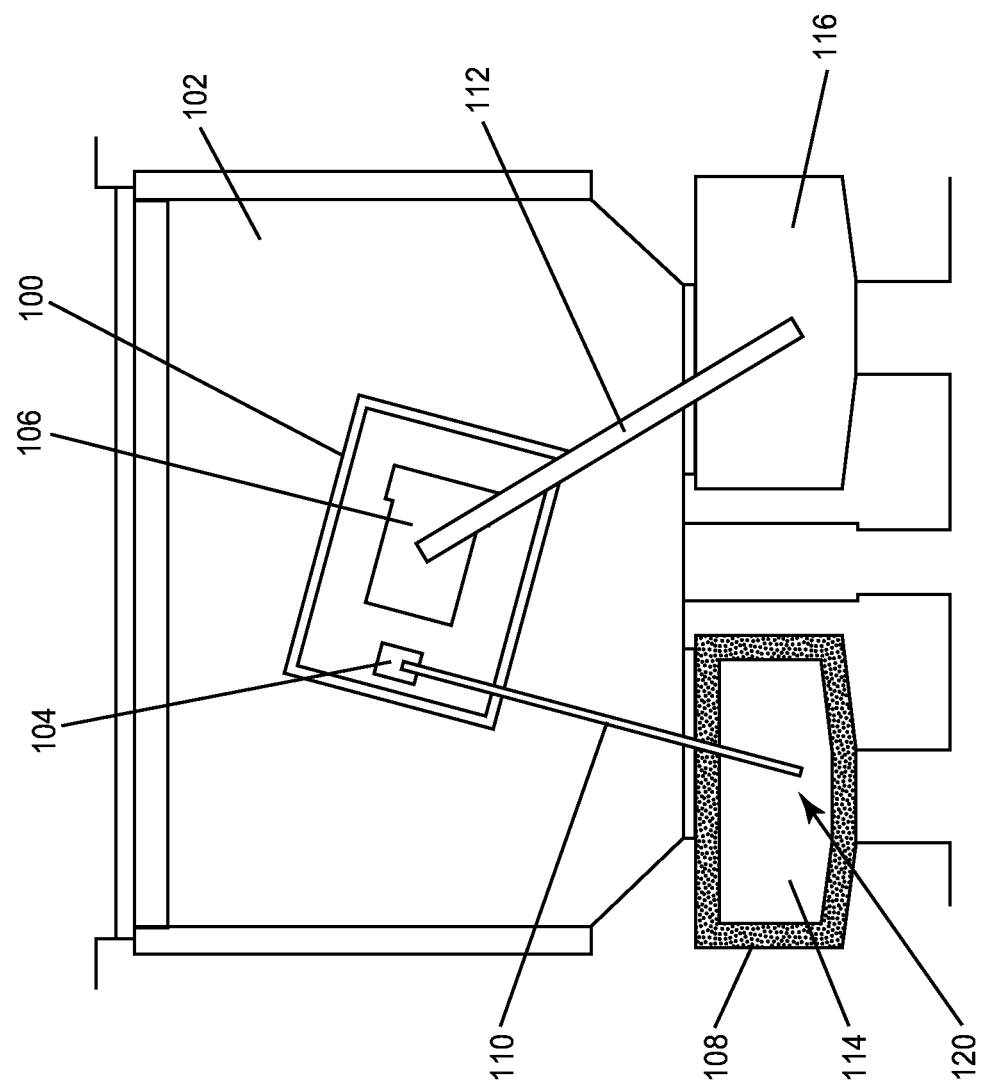
FIG. 3 illustrates a top-down plan view of an embodiment of a molded semiconductor package having integrated ferrite material, prior to encapsulation.

FIG. 3 shows a top-down plan view of a package design similar to the design shown in FIG. 1D prior encapsulation. Different than the embodiment shown in FIG. 1D, the ferrite material 108 is disposed on a bonding region 120 of the gate lead 114 of the lead frame instead of on the gate pad 104 of the semiconductor die 100. According to this embodiment, the ring of ferrite material 108 surrounds the electrical conductor 110 that connects the gate pad 104 to the gate lead 114 at least where the electrical conductor 110 is attached to the bonding region 120 of the gate lead 114.

Figure 4:
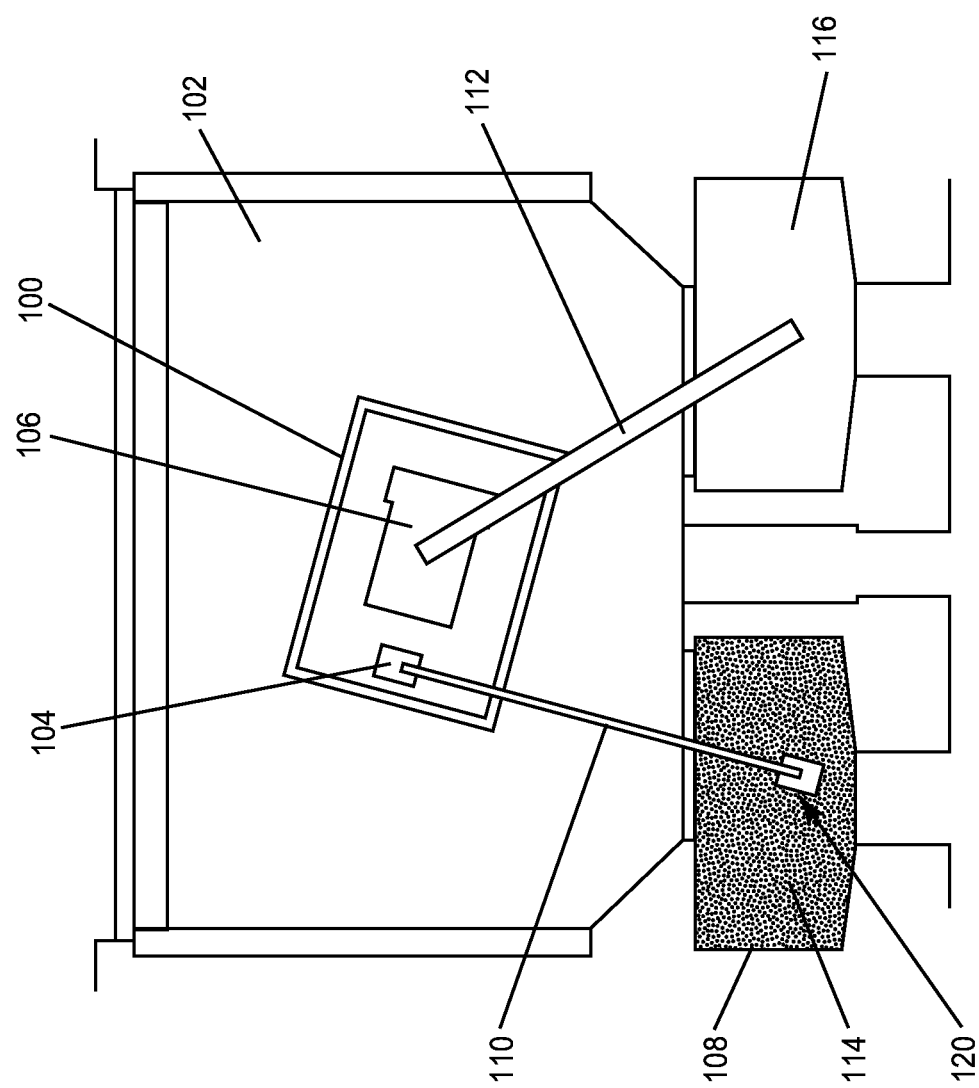
FIG. 4 illustrates a top-down plan view of an embodiment of a molded semiconductor package having integrated ferrite material, prior to encapsulation.

FIG. 4 shows a top-down plan view of a package design similar to the design shown in FIG. 3 prior encapsulation. The ring of ferrite material 108 is wider in FIG. 4 as compared to FIG. 3, leaving less area for attaching the (gate)

electrical conductor 110 to the bonding region 120 of lead frame gate lead 114. In general, the ring of ferrite material 108 can be as wide as desired so long as enough area remains for the bonding region 120 of the gate lead 114 to attach the (gate) electrical conductor 110.

Figure 5A:
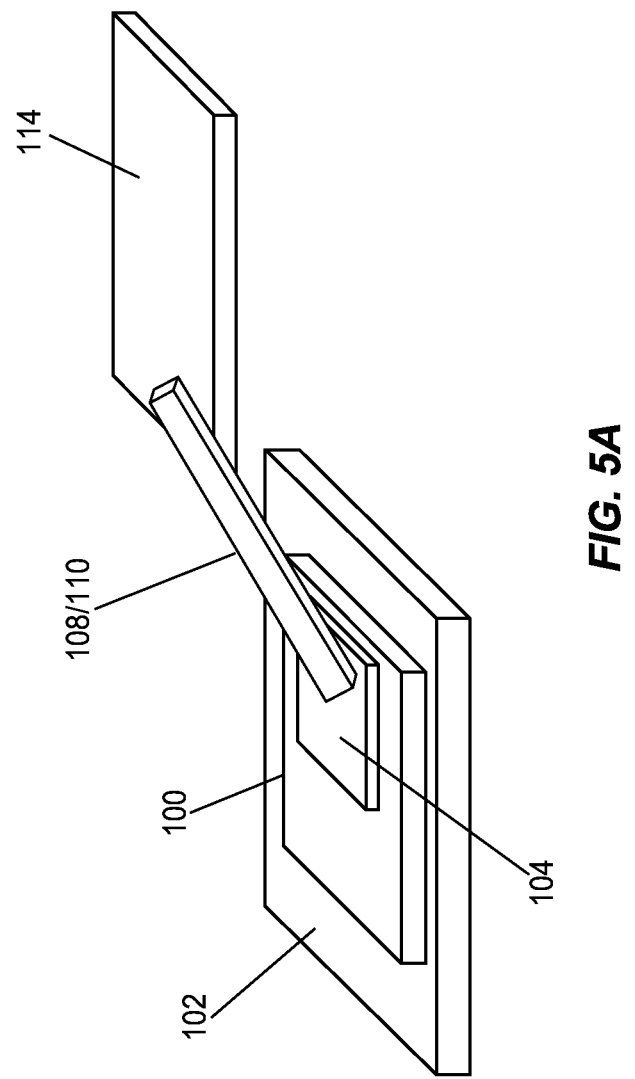

FIG. 5, which includes FIGS. 5A through 5C, shows an embodiment of the ferrite material 108 prior to encapsulation. According to this embodiment, the ferrite material 108 encases the electrical conductor 110 that connects the gate pad 104 of the semiconductor die 100 to the gate lead 114 of the lead frame.

In FIG. 5B, the electrical conductor 110 that connects the gate pad 104 to the gate lead 114 is part of a ferrite bead 130 that also includes the ferrite material 108 which encases the (gate) electrical conductor 110. The ferrite bead 130 can include multiple layers of metal conductors embedded in ferrite sheets and vertically connected by conductive vias or through holes. The ferrite material 108 surrounds the metal layers and vias/through holes. The ferrite bead 130 further includes a first terminal 132 that connects a first end of the electrical conductor 110 to the gate pad 104 of the semiconductor die 100 and a second terminal 134 that connects a second end of the electrical conductor 110 to the gate lead 114 of the lead frame. Any standard or custom-designed ferrite bead can be used.

In FIG. 5C, the electrical conductor 110 that connects the gate pad 104 to the gate lead 114 is a single conductor such as a wire encased by the ferrite material 108. The single conductor 110 is connected at a first end 136 to the gate pad 104 of the semiconductor die 100 and connected at the opposing second end 138 to the gate lead 114 of the lead frame. The single conductor 110 is encased by the ferrite material 108 between the first and second ends 136, 138 of the single conductor 110.

FIG. 6, which includes FIGS. 6A through 6E, illustrates a semiconductor die 200 during stages of packaging the die 200 according to yet another embodiment. The semiconductor die 200 includes a power semiconductor transistor such as a power MOSFET or an IGBT.

In FIG. 6A, the bottom side of the die 200 is attached e.g. via solder or other die attach material to a die paddle 202 of a lead frame. The side of the die 200 facing away from the die paddle 202 includes at least the gate pad 204 for the die 200.

In FIG. 6B, an electrical conductor 206 is connected between the gate pad 204 of the die 200 and the corresponding gate lead 208 of the lead frame. The electrical conductor 110 can be one or more wire bonds, one or more wire ribbons, a metal clip, etc.

In FIG. 6C, a lower part 210 of a ring-shaped ferrite material is attached to the bottom side of the gate lead 208 e.g. by an epoxy. An enlarged cross-sectional view of the lower part 210 of the ring-shaped ferrite material is shown in the bottom part of FIG. 6C.

In FIG. 6D, an upper part 212 of the ring-shaped ferrite material is attached to the top side of the gate lead 208 e.g. by an epoxy. An enlarged cross-sectional view of the upper part 212 of the ring-shaped ferrite material is shown in the upper part of FIG. 6D. Accordingly, the electrical conductor 206 that connects the gate pad 204 of the semiconductor die 200 to the gate lead 208 of the lead frame is attached to a part of the gate lead 208 surrounded by a ring of ferrite material 210, 212 to dampen noise/oscillations/EMI.

In FIG. 6E, the semiconductor die 200, the ring of ferrite material 210, 212 and a portion of the leads 208 are encased in an encapsulant 214 such as a mold compound so that part of the leads 208 are not covered by the encapsulant 214. The ferrite material 210, 212 is embedded in the encapsulant 214 and surrounds a portion of the electrical conductor 206 that connects the gate pad 204 to the gate lead 208.

FIG. 7, which includes FIGS. 7A through 7E, illustrates a semiconductor die 300 during stages of packaging the die 300 according to still another embodiment. The semiconductor die 300 includes a power semiconductor transistor such as a power MOSFET or an IGBT.

In FIG. 7A, the bottom side of the die 300 is attached e.g. via solder or other die attach material to a die paddle 302 of a lead frame. The side of the die 300 facing away from the die paddle 302 includes at least the gate pad 304 for the die 300. Also attached to the same side of the die paddle 302 as the semiconductor die 300 is an electrically insulating substrate 306 that includes metal strips 308, 310 patterned from metal sheets bonded or brazed to the substrate 306 e.g. such as in a direct copper bonded (DCB) substrate, a direct aluminum bonded (DAB) substrate, an active metal brazed (AMB) substrate, etc.

In FIG. 7B, a ferrite bead 312 is attached to the electrically insulating substrate 306 disposed on the die paddle 302. The ferrite bead 312 includes ferrite material which encases an electrical conductor. The ferrite bead 312 can include multiple layers of metal conductors vertically connected by conductive vias or through holes e.g. as shown in FIG. 5B, or a single electrical conductor surrounded by a ferrite material e.g. as shown in FIG. 5C. In either case, the ferrite bead 312 has a first terminal connected to one of the metal strips 308 on the insulating substrate 306 and a second terminal connected to the other metal strip 310 on the insulating substrate 306. This way, the electrical bridge connection provided between the two metal strips 308, 310 of the insulating substrate 306 is encased in a ferrite material.

In FIG. 7C, a first gate electrical conductor (branch) 314 is connected between the gate pad 304 of the semiconductor die 300 and the first metal strip 308 on the insulating substrate 306. The first gate electrical conductor 314 can be one or more wire bonds, one or more wire ribbons, a metal clip, etc.

In FIG. 7D, a second gate electrical conductor (branch) 316 is connected between the second metal strip 310 on the insulating substrate 306 and the corresponding gate lead 318 of the lead frame. The second gate electrical conductor 316 can be one or more wire bonds, one or more wire ribbons, a metal clip, etc. The electrical pathway to the gate terminal of the transistor included in the semiconductor die 300 is formed by the gate lead 318 of the lead frame, the second gate electrical conductor (branch) 316, the second metal strip 310 on the insulating substrate 306, the conductive branch included in the ferrite bead 312, the first metal strip 308 on the insulating substrate 306, the first gate electrical conductor (branch) 314, the die gate pad 304, and the internal wiring within the die 300 that connects the gate pad 304 to the gate terminal of the transistor.

In FIG. 7E, the semiconductor die 300, the ferrite bead 312, the gate electrical conductors 314, 316, the insulating substrate 306, and a portion of the leads 318 are encased in an encapsulant 320 such as a mold compound so that part of the leads 318 are not covered by the encapsulant 320. The ferrite bead 312 is embedded in the encapsulant 320 and surrounds a portion of the electrical pathway between the die gate pad 304 and the lead frame gate lead 318 to dampen noise/oscillations/EMI.

Figure 8:
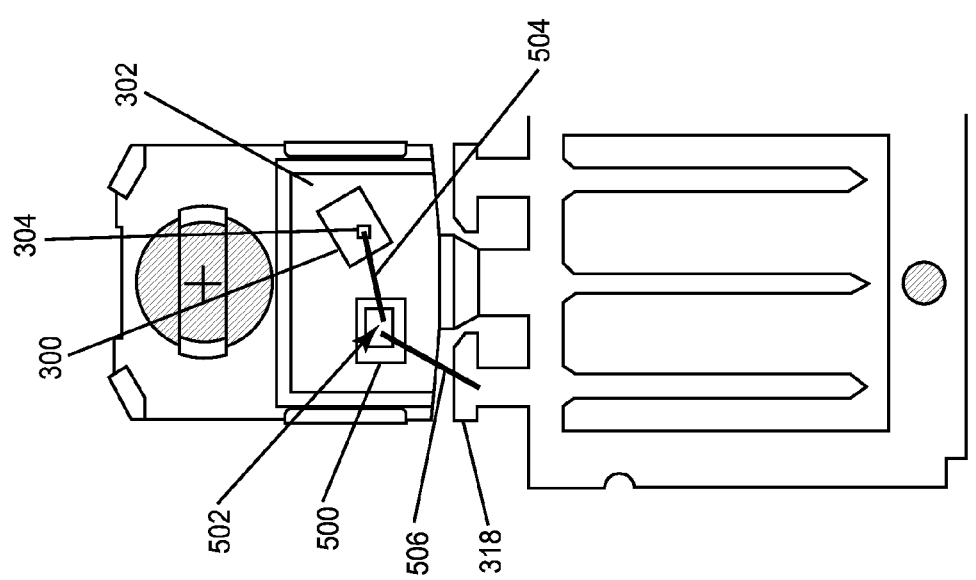
FIG. 8 illustrates a top-down plan view of an embodiment of a molded semiconductor package having integrated ferrite material, prior to encapsulation.

FIG. 8 shows a top-down plan view of another embodiment of a semiconductor package with an integrated ferrite material prior to encapsulation. The embodiment shown in FIG. 8 is similar to the embodiment shown in FIG. 7. Different however is that a ring of ferrite material 400 is disposed on a bonding region 502 of the die paddle 302 instead of a ferrite bead disposed on an insulating substrate having metal strips. According to this embodiment, the electrical conductor that connects the gate pad 304 of the semiconductor die 300 to the gate lead 318 of the lead frame comprises a first electrically conductive branch 504 that connects the gate pad 403 to the bonding region 502 of the die paddle 302 and a second electrically conductive branch 506 that connects the bonding region 502 of the die paddle 302 to the gate lead 318. The ring of ferrite material 500 surrounds the first and second electrically conductive branches 504, 506 at least where the branches 504, 506 are attached to the bonding region 502 of the die paddle 302.

Figure 9:
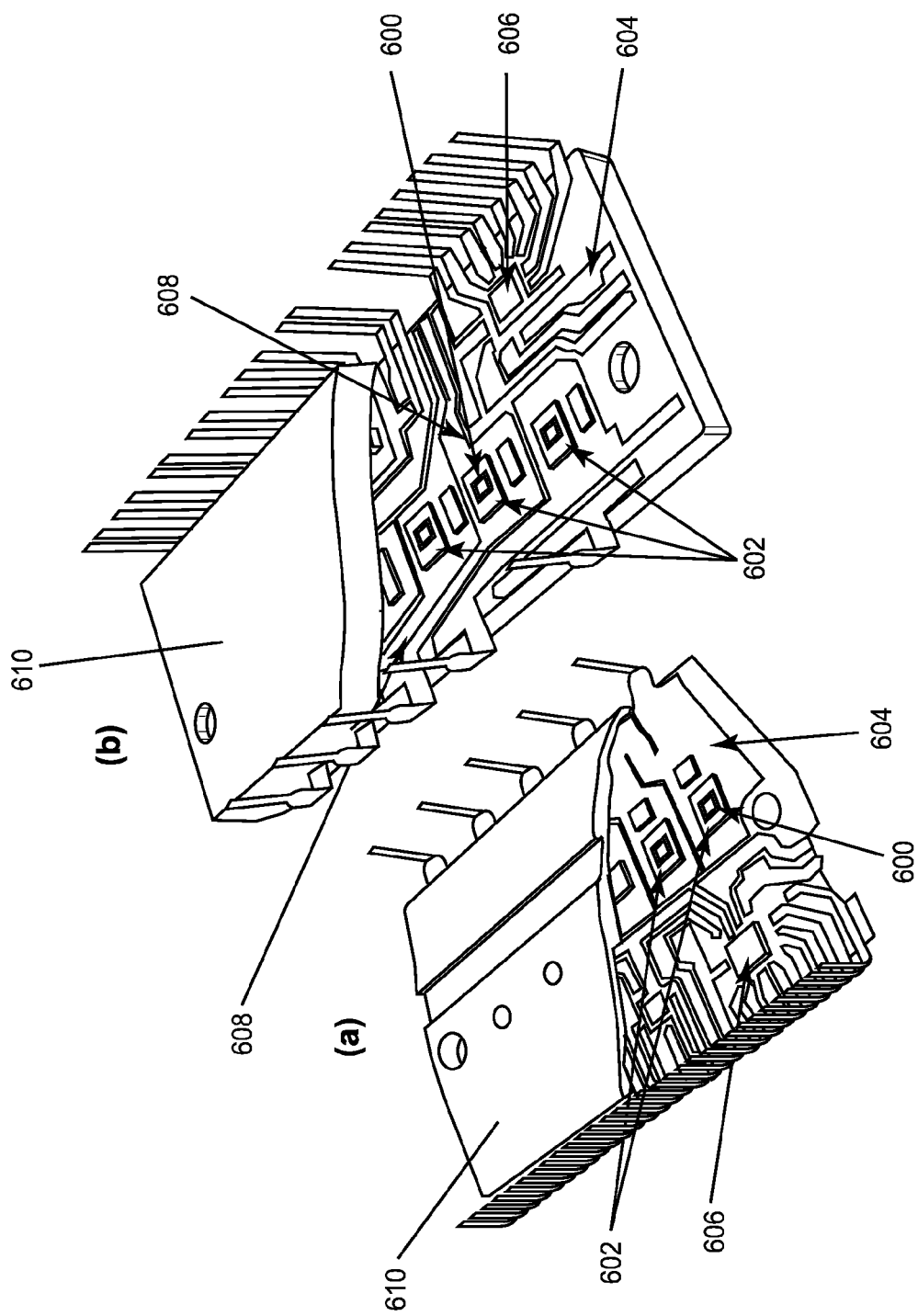
FIG. 9 illustrates a perspective view of an embodiment of a semiconductor module having integrated ferrite material.

FIG. 9 shows a perspective view of two different semiconductor modules (views a and b in FIG. 9) each with an integrated ferrite material 600. In each case, the module includes a plurality of power semiconductor dies 602 attached to a lead frame 604 which acts as a substrate. Each of the power semiconductor dies 602 has a plurality of pads including a gate pad. One or more logic semiconductor dies 606 are attached to the same or different substrate as the power semiconductor dies 602 and operable to drive the gate pads of the respective power semiconductor die 602. For example, each module may include a half-bride or full-bridge circuit and the logic semiconductor dies 604 control switching of the power semiconductor dies 602 that make up the circuit. Electrical conductors 608 connect the die pads to the lead frame 604 and/or to the corresponding logic semiconductor die 606. The electrical conductors can be wire bonds, wire ribbons, metal clips, etc.

Each module also includes a housing 610 for containing the semiconductor dies 602, 606 and the electrical conductors 608. According to the embodiments shown in FIG. 9, the housing 610 is an encapsulant such as a mold compound that encases the semiconductor dies 602, 606 and the electrical conductors 608.

A ferrite material 600 contained in the housing 610 surrounds a portion of each electrical conductor 608 that connects the gate pad of one power semiconductor die 602 to the lead frame 604 or corresponding logic semiconductor die 606. The ferrite material 600 is in the form of a ring disposed on the gate pad of each power semiconductor die 602 in FIG. 9. According to this embodiment, each electrical conductor 608 that connects the gate pad of one power semiconductor die 602 to the lead frame 604 or corresponding logic semiconductor die 606 is attached to a part of the gate pad surrounded by the ring of ferrite material 600.

Figure 10:
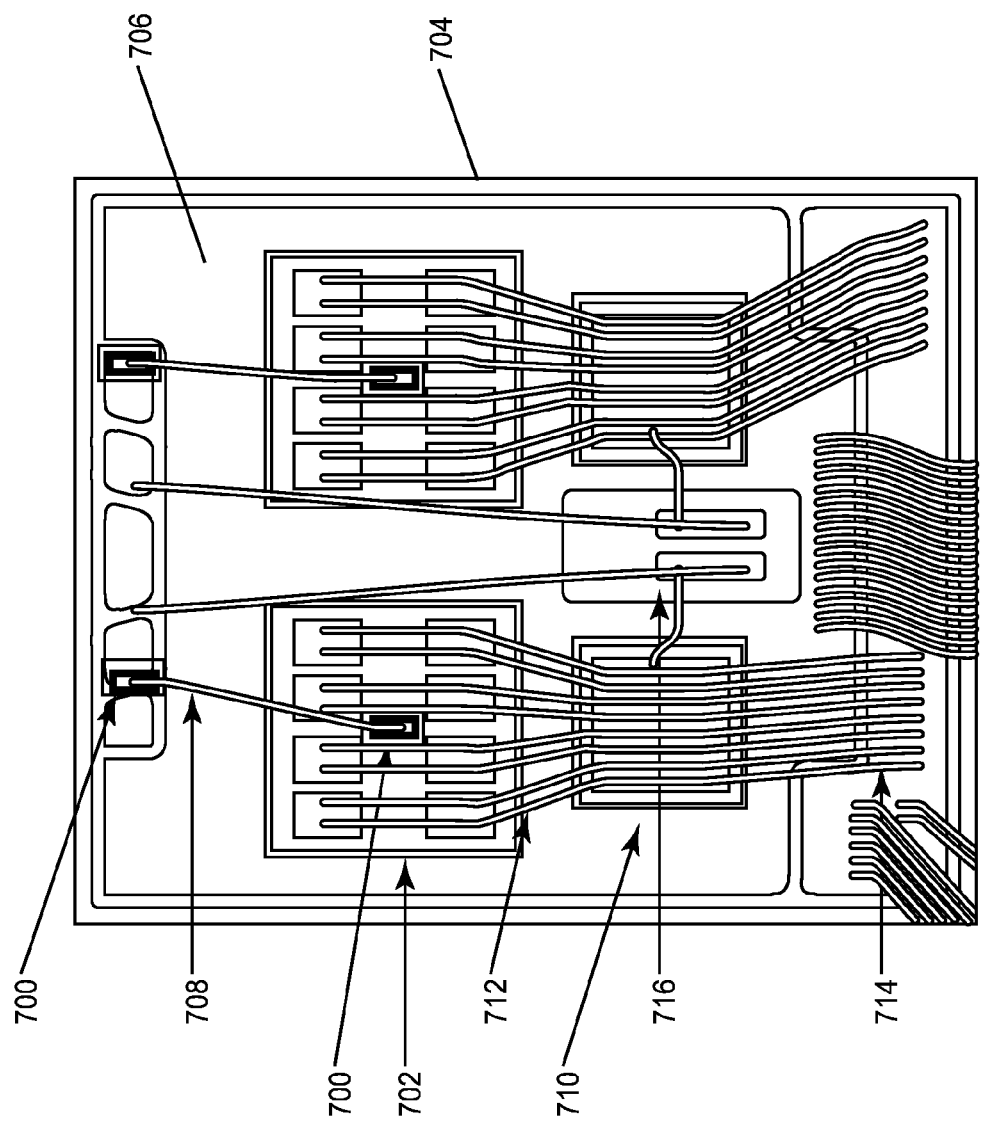
FIG. 10 illustrates a top-down plan view of an embodiment of a semiconductor module having integrated ferrite material, prior to the housing being provided.

FIG. 10 shows a perspective view of another embodiment of a semiconductor module having integrated ferrite material 700, before the housing is provided. Different than the embodiment of FIG. 9, power semiconductor dies 702 are attached to an insulating substrate 704 having a metallized surface 706. The metallized surface 706 of the insulating substrate 704 can be patterned from metal sheets bonded or brazed to the substrate 704 e.g. such as in a direct copper bonded (DCB) substrate, a direct aluminum bonded (DAB) substrate, an active metal brazed (AMB) substrate, etc. The bottom side of each power semiconductor die 702 is attached e.g. via solder or other die attach material to the metallized surface 706 of the insulating substrate 704. The side of each power semiconductor die 702 facing away from the substrate 704 includes at least the gate pad for the power die. The gate pad is electrically connected to the metallized surface 706 of the insulating substrate 704 via electrical conductors 708 such as wire bonds, wire ribbons, metal clips, etc. In the case of IGBT semiconductor dies 702, a separate freewheeling diode die 710 can be electrically connected to the emitter of the corresponding IGBT die 702 by electrical conductors 712. Main and auxiliary conductors 714, 716 can also be provided for the emitter connection.

A ferrite material 700 is disposed in the form of a ring on the gate pad of each power semiconductor die 702 and/or on the part of the metallized surface 706 of the insulating substrate 704 to which the gate electrical conductors 708 are attached. In one embodiment, the ferrite material 700 is a ferrite core with a hollow (open) center which can be glued e.g. via epoxy to each gate pad and/or to the metallized surface 706 of the insulating substrate 704. Alternatively, the ferrite material 700 can be sputtered or electroplated on each gate pad and/or on the part of the metallized surface 706 of the insulating substrate 704 to which the gate electrical conductors 708 are attached.

Figure 11:
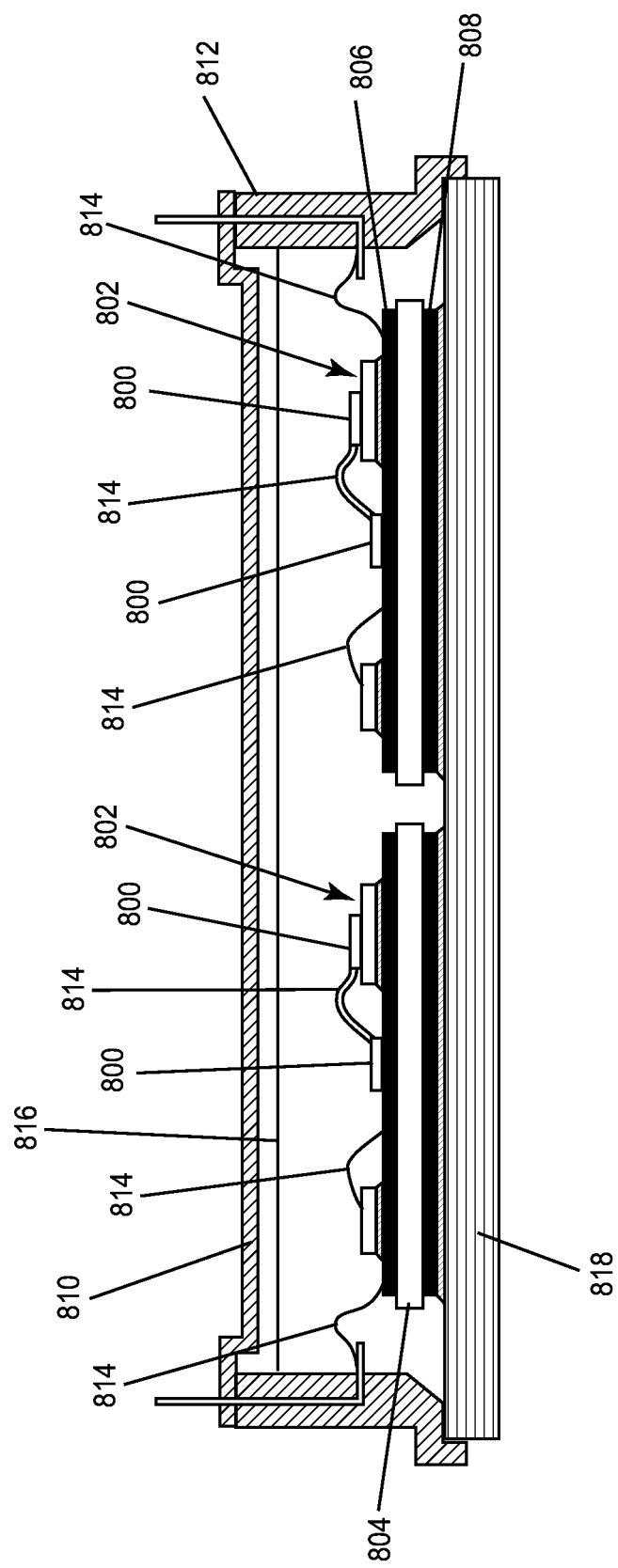
FIG. 11 illustrates a sectional view of an embodiment of a semiconductor module having integrated ferrite material.

FIG. 11 shows a sectional view of an embodiment of a semiconductor module having integrated ferrite material 800 and with the housing place. According to this embodiment, power semiconductor dies 802 are disposed on an insulating substrate 804 having metallized top and bottom surfaces 806, 808 such as a direct copper bonded (DCB) substrate, a direct aluminum bonded (DAB) substrate, an active metal brazed (AMB) substrate, etc. e.g. as shown in FIG. 10. Further according to this embodiment, the housing includes a lid 810 and a frame 812 for containing the semiconductor dies 802 and electrical conductors 814. The lid 810 and frame 812 can be made of plastic or any other suitable material for a power semiconductor module housing. The housing can be air-filled or at least partly filled with a material 816 such as silicone gel. A base plate 818 can be attached to the bottom metallized surface 808 of the insulating substrate 804.

Figure 12:
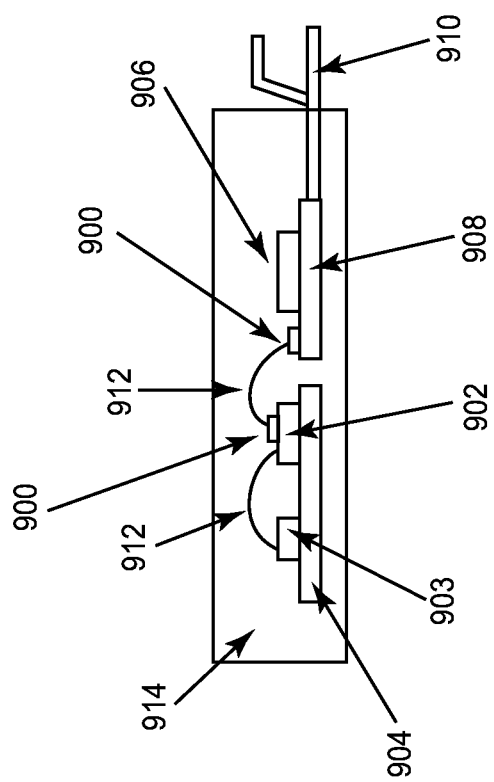
FIG. 12 illustrates a sectional view of an embodiment of a semiconductor module having integrated ferrite material.

FIG. 12 shows a sectional view of another embodiment of a semiconductor module having integrated ferrite material 900 and with the housing place. According to this embodiment, each power semiconductor die 902 and corresponding diode die 903 is attached to a DCB substrate 904 and each logic semiconductor die 906 that controls operation of one or more of the power dies 902 is attached to a printed circuit board (PCB) 908 which in turn is connected to a lead frame 910. Each logic die 906 drives the gate pad of a corresponding power semiconductor die 902. The housing that contains the semiconductor dies 902, 903, 906 and corresponding electrical conductors 912 is an encapsulant 914 according to this embodiment. The ferrite material 900 contained in the housing 914 surrounds a portion of the electrical conductor 912 that connects the gate pad of each power semiconductor die 902 to the corresponding logic semiconductor die 906 to dampen noise/oscillations/EMI.

The ferrite material 900 can be disposed on the gate pad of each power semiconductor die 902 as previously described herein. Alternatively or in addition, the ferrite material 900 can be disposed on a pad of the corresponding logic semiconductor die 906 e.g. as shown in FIG. 9, or to a bonding region of the substrate 904 to which the power semiconductor die 902 is attached e.g. as shown in FIGS. 10 and 11, or to a bonding region of the substrate 908 to which the corresponding logic die 906 is attached e.g. as shown in FIG. 12. In yet another embodiment, each electrical conductor 912 that connects the gate pad of one power semiconductor die 902 to the corresponding logic semiconductor die 906 can be implemented as a ferrite bead that includes ferrite material which encases the gate electrical conductor e.g. as shown in FIGS. 5B and 5C.

Figure 13:
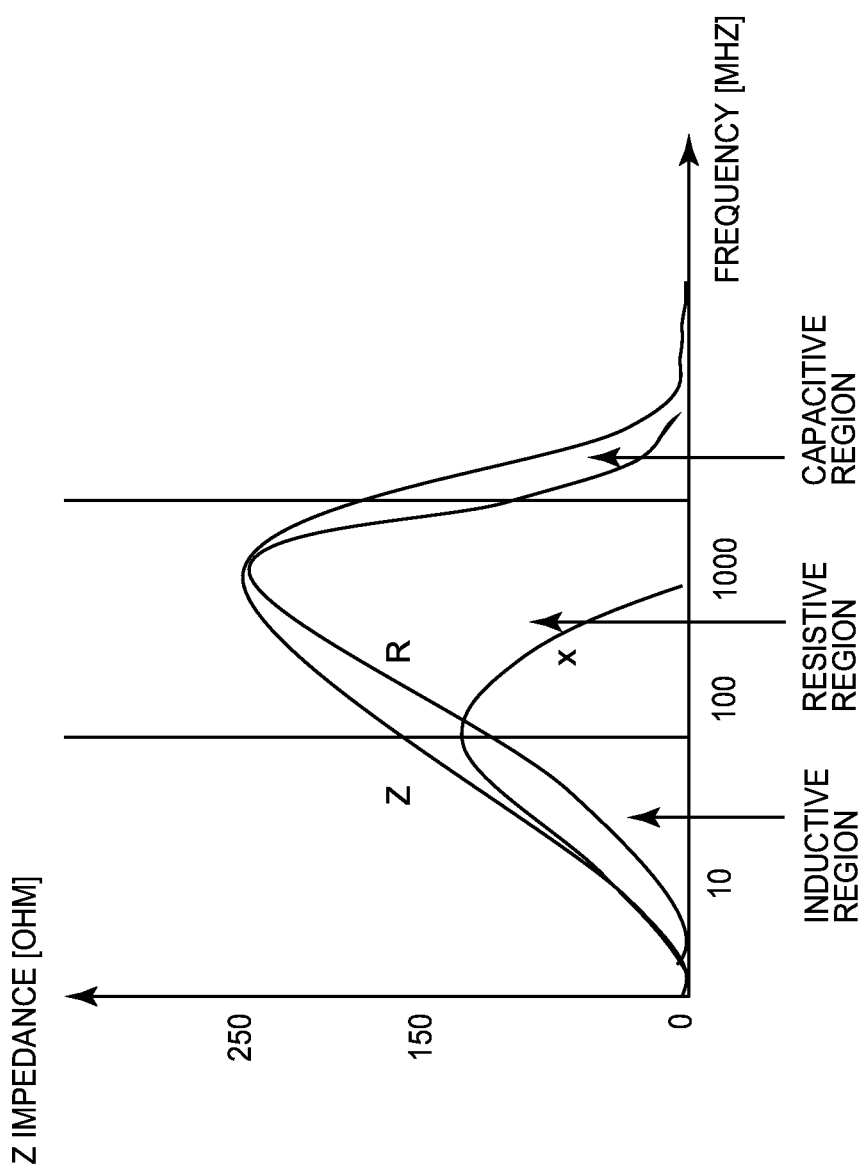
FIG. 13 illustrates the impedance response of ferrite material over frequency.

FIG. 13 illustrates the impedance response of an exemplary ferrite material over frequency. The ferrite material has an inductive region, a resistive region and a capacitive region over a wide frequency range. In each embodiment described herein, the ferrite material can be selected such that the ferrite material has a resistive response over the frequency operating range of the semiconductor die for which the ferrite material is provided to dampen noise/oscillations/EMI. The choice of ferrite material depends on the type of application and package/module constraints.

Figure 14:
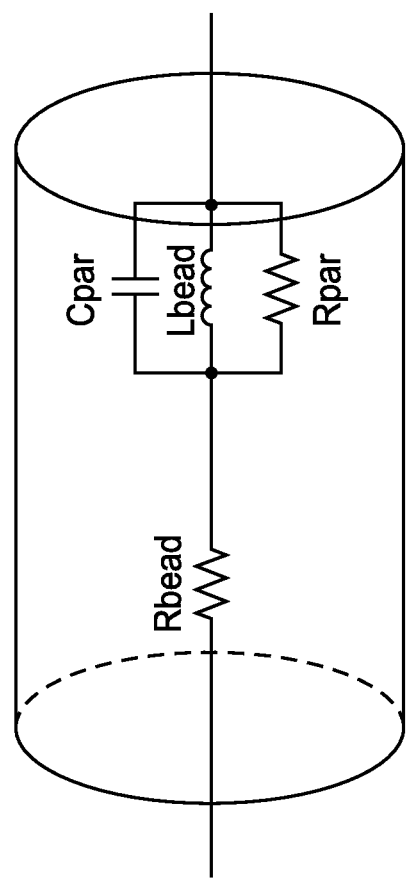
FIG. 14 illustrates the equivalent circuit of the ferrite material having the impedance response shown in FIG. 13.

FIG. 14 illustrates the equivalent circuit of the ferrite material having the impedance response shown in FIG. 13. In FIG. 14, Rbead is the resistance of the ferrite material and Lbead is the inductance of the ferrite material. Cpar and Rpar are capacitive and resistive components, respectively.

Spatially relative terms such as "under", "below", "lower", "over", "upper" and the like, are used for ease of description to explain the positioning of one element relative to a second element. These terms are intended to encompass different orientations of the package in addition to different orientations than those depicted in the figures. Further, terms such as "first", "second", and the like, are also used to describe various elements, regions, sections, etc. and are also not intended to be limiting. Like terms refer to like elements throughout the description.

As used herein, the terms "having", "containing", "including", "comprising" and the like are open-ended terms that indicate the presence of stated elements or features, but do not preclude additional elements or features. The articles "a", "an" and "the" are intended to include the plural as well as the singular, unless the context clearly indicates otherwise.

With the above range of variations and applications in mind, it should be understood that the present invention is not limited by the foregoing description, nor is it limited by the accompanying drawings. Instead, the present invention is limited only by the following claims and their legal equivalents.

What is claimed is:

1. A semiconductor package, comprising:
a lead frame comprising a die paddle and a plurality of leads including a gate lead spaced apart from the die paddle;
a semiconductor die attached to the die paddle and having a plurality of pads including a gate pad;
a plurality of electrical conductors connecting the pads to the leads;
an encapsulant encasing the semiconductor die and a portion of the leads such that part of the leads are not covered by the encapsulant; and
a ferrite material embedded in the encapsulant and surrounding a portion of the electrical conductor that connects the gate pad to the gate lead,
wherein the ferrite material is formed as a continuous uninterrupted structure located near the electrical conductor,
wherein the ferrite material is in the form of a ring disposed on the gate pad, and
wherein the electrical conductor that connects the gate pad to the gate lead is attached to a part of the gate pad surrounded by the ring of ferrite material.

2. The semiconductor package of claim 1, wherein the ferrite material has a resistive response over a frequency operating range of the semiconductor die.

3. The semiconductor package of claim 1, further comprising:
an electrically insulating substrate attached to the same side of the die paddle as the semiconductor die,
wherein the electrical conductor that connects the gate pad to the gate lead comprises a first electrically conductive branch that connects the gate pad to a first metal strip on the electrically insulating substrate, a second electrically conductive branch that connects the first metal strip to a second metal strip on the electrically insulating substrate, and a third electrically conductive branch that connects the second metal strip to the gate lead,
wherein the second electrically conductive branch is part of a ferrite bead that also includes the ferrite material which encases the second electrically conductive branch,
wherein each branch of the electrical conductor that connects the gate pad to the gate lead is embedded in the encapsulant.

4. A semiconductor package, comprising:
a lead frame comprising a die paddle and a plurality of leads including a gate lead spaced apart from the die paddle;
a semiconductor die attached to the die paddle and having a plurality of pads including a gate pad;
a plurality of electrical conductors connecting the pads to the leads;
an encapsulant encasing the semiconductor die and a portion of the leads such that part of the leads are not covered by the encapsulant; and
a ferrite material embedded in the encapsulant and surrounding a portion of the electrical conductor that connects the gate pad to the gate lead,
wherein the ferrite material is formed as a continuous uninterrupted structure located near the electrical conductor,
wherein the ferrite material is in the form of a ring disposed on a bonding region of the gate lead encased by the encapsulant, and
wherein the electrical conductor that connects the gate pad to the gate lead is attached to a part of the bonding region of the gate lead surrounded by the ring of ferrite material.

5. A semiconductor package, comprising:
a lead frame comprising a die paddle and a plurality of leads including a gate lead spaced apart from the die paddle;
a semiconductor die attached to the die paddle and having a plurality of pads including a gate pad;
a plurality of electrical conductors connecting the pads to the leads;
an encapsulant encasing the semiconductor die and a portion of the leads such that part of the leads are not covered by the encapsulant; and
a ferrite material embedded in the encapsulant and surrounding a portion of the electrical conductor that connects the gate pad to the gate lead,
wherein the ferrite material is formed as a continuous uninterrupted structure located near the electrical conductor,
wherein the ferrite material is in the form of a ring disposed on a bonding region of the die paddle, wherein the electrical conductor that connects the gate pad to the gate lead comprises a first electrically conductive branch that connects the gate pad to the bonding region of the die paddle and a second electrically conductive branch that connects the bonding region of the die paddle to the gate lead, and wherein the ring of ferrite material surrounds the first and the second electrically conductive branches at least where the first and the second electrically conductive branches are attached to the bonding region of the die paddle.

6. A semiconductor package, comprising:
a lead frame comprising a die paddle and a plurality of leads including a gate lead spaced apart from the die paddle;
a semiconductor die attached to the die paddle and having a plurality of pads including a gate pad;
a plurality of electrical conductors connecting the pads to the leads;
an encapsulant encasing the semiconductor die and a portion of the leads such that part of the leads are not covered by the encapsulant; and
a ferrite material embedded in the encapsulant and surrounding a portion of the electrical conductor that connects the gate pad to the gate lead,
wherein the ferrite material is formed as a continuous uninterrupted structure located near the electrical conductor,
wherein the electrical conductor that connects the gate pad to the gate lead is part of a ferrite bead that also includes the ferrite material which encases the electrical conductor, the ferrite bead further including a first terminal that connects a first end of the electrical conductor to the gate pad and a second terminal that connects a second end of the electrical conductor to the gate lead.

* * * * *